United States Patent
Gallegos et al.

[11] Patent Number: 5,992,835
[45] Date of Patent: Nov. 30, 1999

[54] OMNIDIRECTIONAL WORK TABLE FIXTURE FOR PRINTED CIRCUIT BOARD REPAIR

[75] Inventors: Carl A. Gallegos, Thornton; Harvey R. Hoogstrate, Denver, both of Colo.

[73] Assignee: Lucent Technologies Inc., Murray Hill, N.J.

[21] Appl. No.: 09/114,814

[22] Filed: Jul. 13, 1998

[51] Int. Cl.⁶ .................................................. B23Q 3/00
[52] U.S. Cl. ..................... 269/17; 264/296; 264/254 CS; 264/903
[58] Field of Search ....................... 269/17, 296, 254 CS, 269/903; 228/49.4, 44.7; 248/188.8, 188.9, 677; 211/41.17; 16/21, 24, 26

[56] References Cited

U.S. PATENT DOCUMENTS

| | | | |
|---|---|---|---|
| 2,719,043 | 9/1955 | Oppenheimer | 16/24 |
| 3,285,447 | 11/1966 | Junion | 16/24 |
| 3,288,301 | 11/1966 | Kent et al. | 211/41.17 |
| 3,395,439 | 8/1968 | Palesi et al. | 269/296 |
| 3,826,483 | 7/1974 | Siegel | 269/903 |
| 3,893,700 | 7/1975 | Dunmyer | 16/24 |
| 4,002,953 | 1/1977 | Tetlie | 211/41.17 |
| 5,626,067 | 5/1997 | Lothe | 269/289 R |

*Primary Examiner*—Robert C. Watson

[57] ABSTRACT

The omnidirectional work table fixture for printed circuit board repair that enables the operator to both laterally and rotationally position the printed circuit board. This is accomplished by providing a mounting plate on one major surface of which is affixed a printed circuit board fixture to hold the printed circuit board in place. On the other major surface is mounted a plurality of omnidirectional rollers which enable smooth movement of the omnidirectional work table fixture in any direction, both laterally (X-Y direction) as well as rotationally. The use of the single set of omnidirectional rollers minimizes the height of the omnidirectional work table fixture so that the printed circuit board surface is closer to the work bench on which the omnidirectional work table fixture rests than in the case of the X-Y work tables, thereby providing the operator with a more comfortable working height as well as freeing the operator's hands to manipulate tools, since the omnidirectional work table fixture can be simply moved with the heel of the hand or forearms. The omnidirectional rollers also provide a grounding path to the work bench on which the omnidirectional work table fixture is placed, thereby reducing the risk of electrostatic discharge.

5 Claims, 2 Drawing Sheets

OMNIDIRECTIONAL WORK TABLE FIXTURE FOR PRINTED CIRCUIT BOARD REPAIR

FIELD OF THE INVENTION

This invention relates to printed circuit board maintenance fixtures and in particular to a work table fixture that eliminates the need for expensive X-Y work tables and provides the operator with a fixture that is ergonomically correct and that enables the printed circuit board to be translated both laterally as well as rotated with little effort.

PROBLEM

It is a problem in the field of printed circuit board maintenance fixtures to provide a work surface and printed circuit board mounting fixtures that simplify the testing and repair of printed circuit boards. Typically, printed circuit board repair operations use X-Y work tables that are expensive fixtures implemented with two sets of bearings: X bearings and Y bearings, to enable an operator to translate the printed circuit board a limited distance in either the X direction or Y direction to thereby center the printed circuit board in front of the operator and under a microscope of other magnifying device. The X bearings, Y bearings, and base plate of an X-Y work table are mounted one on top of the other which results in an increased height of the work surface above the work bench on which the X-Y work table is placed. This results in a resultant height of the printed circuit board that is ergonomically incorrect for the operator who must perform the printed circuit repair. The operator cannot comfortably rest their forearm on the X-Y work table surface while moving the X-Y work table into position while also being able to position tools, such as a soldering iron to perform the test and repair operations. In addition, the X-Y work table provides only lateral translation of the printed circuit board, not rotational movement, which limits the ability of the operator to most efficiently effect a repair.

Thus, while the existing X-Y work tables provide a valuable tool to asset operators in testing and repairing printed circuit boards, they are expensive and also have physical limitations that inhibit achieving a desirable level of comfort and efficiency for the operator.

SOLUTION

The above described problems are solved and a technical advance achieved by the present omnidirectional work table fixture for printed circuit board repair that enables the operator to both laterally and rotationally position the printed circuit board. This is accomplished by providing a mounting plate, on one major surface of which is affixed a printed circuit board fixture to hold the printed circuit board in place. A plurality of omnidirectional rollers are attached to the other major surface of the mounting plate and function to enable smooth movement of the omnidirectional work table fixture in any direction, both laterally (X-Y direction) as well as rotationally. The use of the single set of omnidirectional rollers minimizes the height of the omnidirectional work table fixture so that the printed circuit board surface is closer to the work bench on which the omnidirectional work table fixture rests than in the case of the X-Y work tables, thereby providing the operator with a more comfortable working height. This architecture also frees the operator's hands to manipulate tools, since the omnidirectional work table fixture can be simply moved with the heel of the hand or forearms. The omnidirectional rollers also provide a grounding path from the printed circuit board to the work bench on which the omnidirectional work table fixture is placed, thereby reducing the risk of electrostatic discharge.

DETAILED DESCRIPTION

In the field of printed circuit boards, it is not uncommon for a printed circuit board to require testing, repairs, and updates. In order to accomplish this work, the printed circuit board is typically placed in a fixture that secures the printed circuit board to a work table that is placed on a work bench that is used by an operator to perform the required work. The simple and precise positioning of the printed circuit board is necessary to facilitate this work, since the operator commonly uses a magnifying device to assist their ability to view the confined work area. The height of the printed circuit board above the work bench on which the fixture is placed is an important factor to minimize operator muscle fatigue and enable the operator to have precise control of the tools used in the repair work.

Figure 1:
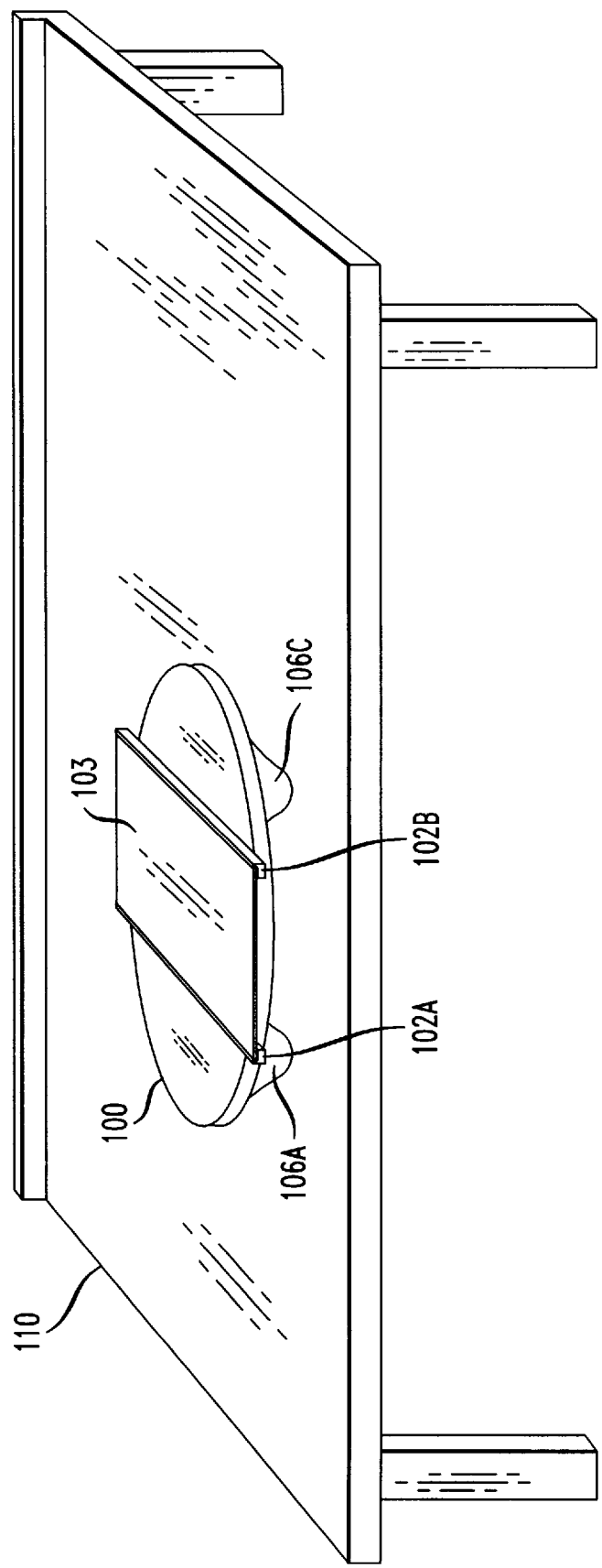
FIGS. 1–3 illustrate perspective, side plan and top plan views of the present omnidirectional work table fixture.
Figure 2:
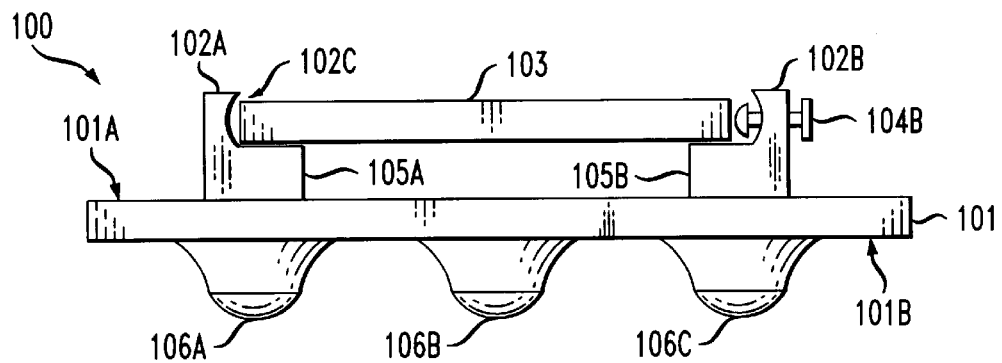
Figure 3:
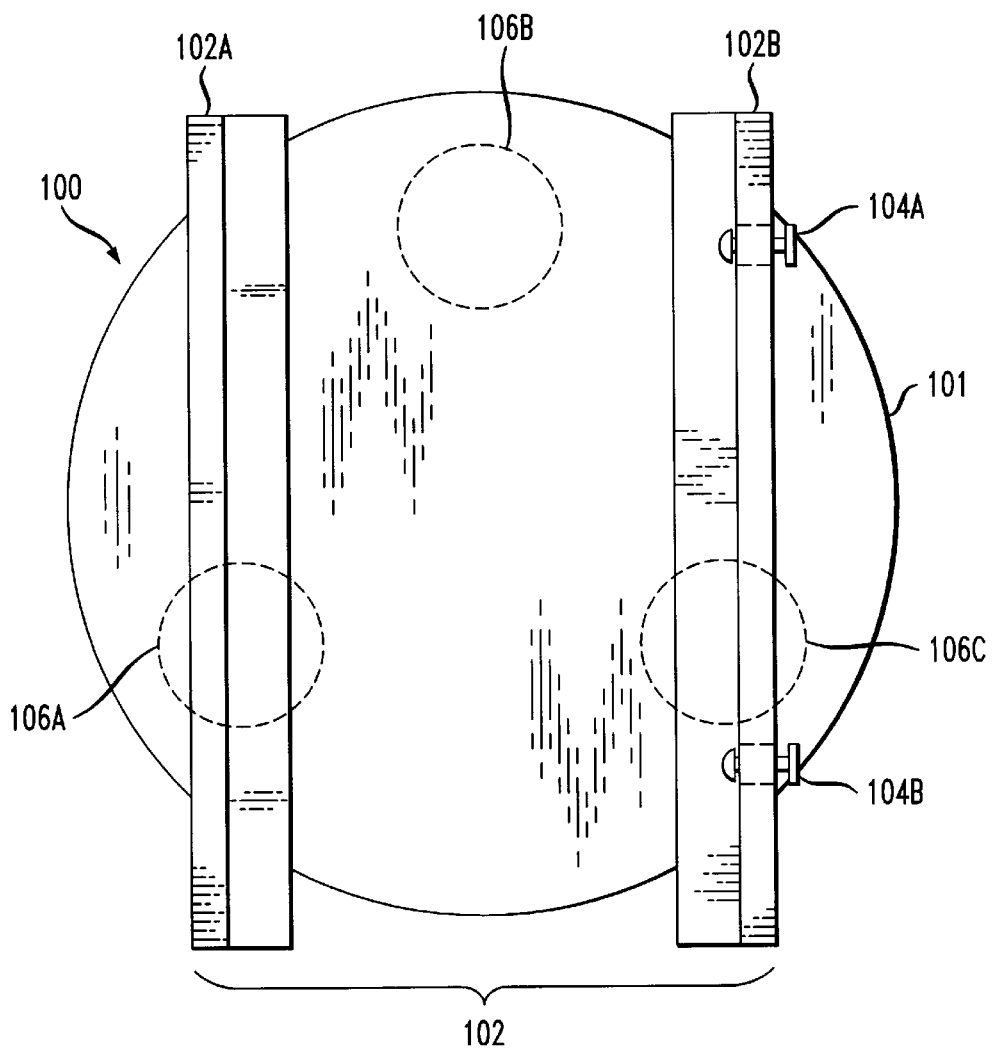

In order to facilitate this work, the present omnidirectional work table fixture for printed circuit board repair enables the operator to both laterally and rotationally position the printed circuit board on a work bench. FIGS. 1–3 illustrate perspective, side plan and top plan views of the present omnidirectional work table fixture 100 that comprises a mounting plate 101 that is typically manufactured from a lightweight metal, such as aluminum. On one major surface 101A of the mounting plate 101 is affixed a printed circuit board fixture 102 to hold the printed circuit board 103 in place. The fixture 102 comprises a pair of parallel oriented spaced apart rails 102A, 102B, at least one of which 102B includes a printed circuit board locking mechanism 104A, 104B, such as at least one spring loaded clamp to secure a printed circuit board 103 in place, when placed between the rails 102A, 102B. One of the rails 102A can optionally include a recess 102C formed along the length thereof to receive one edge of the printed circuit board 103 and prevent its horizontal and vertical movement. The rails 102A, 102B include a shoulder 105A, 105B that contact the conductors of the printed circuit board 103, thereby functioning to ground these conductors to the mounting plate 101. On the other major surface 101B of the mounting plate 101 are mounted a plurality of omnidirectional rollers 106A–C which enable smooth movement of the omnidirectional work table fixture 100 in any direction, both laterally (X-Y direction) as well as rotationally when placed on the work bench 110. The use of the single set of omnidirectional rollers 106A–C minimizes the height of the omnidirectional work table fixture 100 so that the printed circuit board surface is closer to the work bench 110 on which the omnidirectional work table fixture 100 rests than in the case of the X-Y work tables. This reduced height provides the operator with a more comfortable working height as well as frees the operator's hands to manipulate tools, since the omnidirectional work table fixture 100 can be simply moved with the heel of the hand or forearms. The omnidirectional rollers also provide a grounding path to the work bench 110 on which the omnidirectional work table fixture 100 is placed, thereby reducing the risk of electrostatic discharge.

SUMMARY

Thus, the work table fixture eliminates the need for expensive X-Y work tables and provides the operator with a fixture that is ergonomically correct and that enables the printed circuit board to be translated both laterally as well as rotated with little effort.

What is claimed:

1. A work table for securely holding a printed circuit board to enable an operator to work on said printed circuit board, comprising:

a mounting plate having first and second major surfaces, comprising top and bottom surfaces thereof, respectively;

means, mounted on said first major surface, for clamping a printed circuit board to said mounting plate; and a plurality of roller means mounted on said second major surface for enabling said work table to be moved across a surface on which it is placed.

2. The work table of claim 1 wherein said means for clamping comprises:

first and second rails, mounted on said first major surface of said mounting plate in a parallel oriented, spaced apart relationship; and clamp means attached to said second rail and operable to prevent movement of a printed circuit board placed between said first and second rails.

3. The work table of claim 1 wherein said plurality of roller means comprises:

at least three omnidirectional rollers that are attached to said second major surface of said mounting plate in a triangular spaced apart arrangement, for facilitating movement in any direction along said surface.

4. A work table for securely holding a printed circuit board to enable an operator to work on said printed circuit board, comprising:

a mounting plate having first and second major surfaces, comprising top and bottom surfaces thereof, respectively;

first and second rails, mounted on said first major surface of said mounting plate in a parallel oriented, spaced apart relationship;

clamp means attached to said second rail and operable to prevent movement of a printed circuit board placed between said first and second rails; and at least three omnidirectional rollers that are attached to said second major surface of said mounting plate in a triangular spaced apart arrangement, for facilitating movement in any direction along said surface.

5. The work table of claim 1, wherein said roller means provides a grounding path from the printed circuit board to the work bench.

* * * * *